(12) United States Patent
Nair

(10) Patent No.: US 6,690,222 B2
(45) Date of Patent: Feb. 10, 2004

(54) INPUT PAD WITH IMPROVED NOISE IMMUNITY AND OUTPUT CHARACTERISTICS

(75) Inventor: Mukesh Nair, Pune (IN)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 10/175,423

(22) Filed: Jun. 19, 2002

(65) Prior Publication Data
US 2003/0001645 A1 Jan. 2, 2003

(30) Foreign Application Priority Data
Jun. 20, 2001 (EP) .............................................. 01202392

(51) Int. Cl.[7] .............................................. H03K 3/037
(52) U.S. Cl. ...................................... 327/205; 327/206
(58) Field of Search ................................. 327/205, 206, 327/208, 210, 214, 219, 333

(56) References Cited

U.S. PATENT DOCUMENTS

| 3,581,120 A | | 5/1971 | Nord ........................... 307/290 |
|---|---|---|---|
| 4,286,176 A | | 8/1981 | Jarrett et al. ................. 307/261 |
| 4,562,362 A | | 12/1985 | Stenbock .................... 307/290 |
| 5,247,209 A | | 9/1993 | Cheng ...................... 307/296.5 |
| 5,319,259 A | | 6/1994 | Merrill ....................... 307/443 |
| 5,341,033 A | * | 8/1994 | Koker ........................ 327/206 |
| 5,684,414 A | | 2/1996 | Linebarger et al. ............ 326/75 |
| 5,844,430 A | | 12/1998 | Thurnau et al. .............. 327/74 |
| 6,271,703 B1 | | 3/1999 | Wert ........................... 327/309 |
| 6,060,925 A | * | 5/2000 | Chou .......................... 327/206 |
| 6,127,898 A | * | 10/2000 | Naura ......................... 331/57 |
| 6,181,172 B1 | * | 1/2001 | Callahan ..................... 327/143 |
| 6,388,488 B1 | * | 5/2002 | Ho ............................. 327/206 |
| 6,433,602 B1 | * | 8/2002 | Lall et al. ................... 327/205 |

FOREIGN PATENT DOCUMENTS

WO    WO 9615588    11/1995

* cited by examiner

Primary Examiner—My-Trang Nuton
(74) Attorney, Agent, or Firm—Aaron Waxler

(57) ABSTRACT

A multiple voltage environment input pad with a circuit input comprises a level shifter circuit (A) and a buffer circuit (B). The buffer circuit B comprises an inverter comprising at least two transistors (6, 7) of opposite types, followed by twin controllable voltage dividers (8, 10; 4, 5, 9) of opposite types. Each controllable voltage divider (8, 10; 4, 5, 9) has at least two controllable voltage divider inputs and a controllable voltage divider output. For each of the controllable voltage dividers (8, 10; 4, 5, 9) one of the inputs is connected to an output (16) of the level shifter circuit (A) and another one of the inputs is connected to an output (14) of the inverter. For each of the controllable voltage dividers (8, 10; 4, 5, 9) the voltage divider output is connected to a current input connection of a transistor (6, 7) of corresponding type of the inverter. The level shifter circuit (A) comprises a series pass transistor (2) and in parallel thereto a transistorized capacitor (15). Furthermore a transistorized capacitor (18) is connected between the output of the inverter and the output of one of the two controllable voltage dividers (8, 10; 4, 5, 9).

6 Claims, 4 Drawing Sheets

INPUT PAD WITH IMPROVED NOISE IMMUNITY AND OUTPUT CHARACTERISTICS

BACKGROUND AND SUMMARY

The invention relates to a multiple voltage environment input pad with hysteresis.

The invention also relates to a multiple voltage environment input pad with a circuit input.

In multiple voltage environments the external voltage may differ from the core voltage. The necessary interfacing of an external signal is carried out by a level shifter circuit and a buffer circuit mainly responsible for signal recognition and noise reduction. Together they form the so-called input pad. External signal noise is suppressed by applying hysteresis techniques in which two voltage thresholds (trigger points) are being used. By exceeding the highest of the two the output signal of the interface circuitry becomes 1 and by dropping below the lowest of the two the output signal becomes "0". At in between voltages, the noise immunity region, the output signal remains unchanged.

It is an object of the invention to increase the noise immunity region of the input pad. It is another object of the invention to improve output characteristics of the input pad.

A multiple voltage environment input pad with hysteresis according to the invention thereto is characterized by a level shifter circuit and a buffer circuit, which level shifter circuit comprises a series pass transistor and which buffer circuit defines upper and lower trigger points voltages of the input pad and by a transistorized capacitor connected in parallel to the series pass transistor.

A multiple voltage environment input pad with a circuit input thereto is characterized by a level shifter circuit and buffer circuit, which level shifter circuit comprises a level shifter circuit input connected to the circuit input and a level shifter circuit output, which buffer circuit comprises an inverter comprising at least two transistors of opposite polarities, with an input, connected to the level shifter circuit output, and an output, twin controllable voltage dividers of opposite types, each with two controllable voltage divider inputs and a controllable voltage divider output, wherein for each of the controllable voltage dividers one of the inputs is connected to the level shifter circuit output and the other one of the inputs is connected to the inverter output, and wherein for each of the controllable voltage dividers the voltage divider output is connected to a current input connection of a transistor of corresponding type of the inverter, an input pad output being connected to the inverter output.

The input pad is used to interface a signal from the bond pad to the core circuit. In a multiple voltage environment the external voltage on the bond pad and the voltage supplied to the core circuit may be different. The external voltage is normally higher than the internal core voltage. Therefore it is necessary to convert an external signal level to a correct voltage level before passing it to the core circuit. Such transformation of voltage level is done by the level shifter circuit.

The external signal coming to the bond pad is not a very clean signal. It may contain some noise pulses and ringing. To avoid a noisy signal to pass to the core and to achieve a clean signal the input pad is specified with an upper trigger point and a lower trigger point specification. The upper trigger point is the input voltage level at which an output voltage of the input pad goes high, the lower trigger point is the input voltage level at which the output of the input pad goes low. If the output of the input pad is already high the output remains unchanged as long as the input signal does not pass the lower trigger point in a downward direction. If the output of the input pad is already low the output remains unchanged as long as the input signal does not pass the upper trigger point in an upward direction. The region between the upper and lower trigger points defines the noise immunity of the circuit. If the upper and lower trigger points are very close to each other then a noise pulse or a ringing of the input signal close to the trigger points will cause the output to change. In a noisy environment it is required that the hysteresis has a high value and the input pad should have upper and lower trigger points that are as far away from each other as possible within boundaries set by the specifications of the circuit to which the output signal of the input pad is to be delivered.

Functionality of an input pad with hysteresis used in a multiple voltage environment can be divided into two parts. The first part consists of interfacing an external voltage level to the core voltage levels. The second part consists of proper recognition of an input signal as "1" or "0" when the input signal crosses the upper trigger point and the lower trigger point, respectively. This requirement holds in particular when the input signal is noisy and does not have a clear "1" or "0" condition.

The first part of the functionality is achieved by a level shifter circuit which comprises a series pass transistor. The second part of the functionality is achieved by a buffer circuit whose upper and lower trigger points are controlled by controllable potential dividers controlling source voltages of transistors of an inverter.

A preferred embodiment of an input pad according to the invention is characterized in that the level shifter circuit comprises a series pass transistor and in that a transistorized capacitor is connected in parallel to the series pass transistor.

A transistorized capacitor is formed by connecting the drain, the source and the bulk together of a transistor to form one terminal while the gate of the transistor forms the other terminal. Thereby it is achieved that an input signal at the input of the level shifter circuit is coupled to the output of the level shifter circuit (charge coupling). Thereby a pulse voltage at the input of the level shifter circuit is distributed between the transistorized capacitor and an input capacitance of the buffer circuit. The transistorized capacitor plays a dual role of speeding up the input pad and also enhancing the voltage at the output of the level shifter circuit when a high voltage appears at the input of the level shifter circuit. Thereby it is possible to achieve high values of allowable input signals, in particular input signals having a higher value than a supply voltage to the input pad. It is to be noted that there is no charge accumulation across the transistorized capacitor as it is shunted by a very low resistance of the series pass transistor, which is permanently on.

A further embodiment of an input pad according to the invention is characterized in that a transistorized capacitor is connected between the output of the inverter and the output of one of the two controllable voltage dividers.

Thereby a positive feedback is introduced, whereby the input pad is able to accept higher values of an input signal at higher frequencies.

A further embodiment of an input pad according to the invention is characterized in that a weak pull up element comprises a pull up transistor connected between a supply voltage and the output of the level shifter circuit and in that a control input of the pull up transistor is connected to the output of the first inverter.

Thereby it is achieved that a weak pull up occurs at the output of the level shifter circuit when an input signal goes high and crosses the upper trigger point.

BRIEF DESCRIPTION OF THE DRAWINGS

The invention shall now further be explained referring to the accompanying drawings in which.

DETAILED DESCRIPTION

Figure 1:
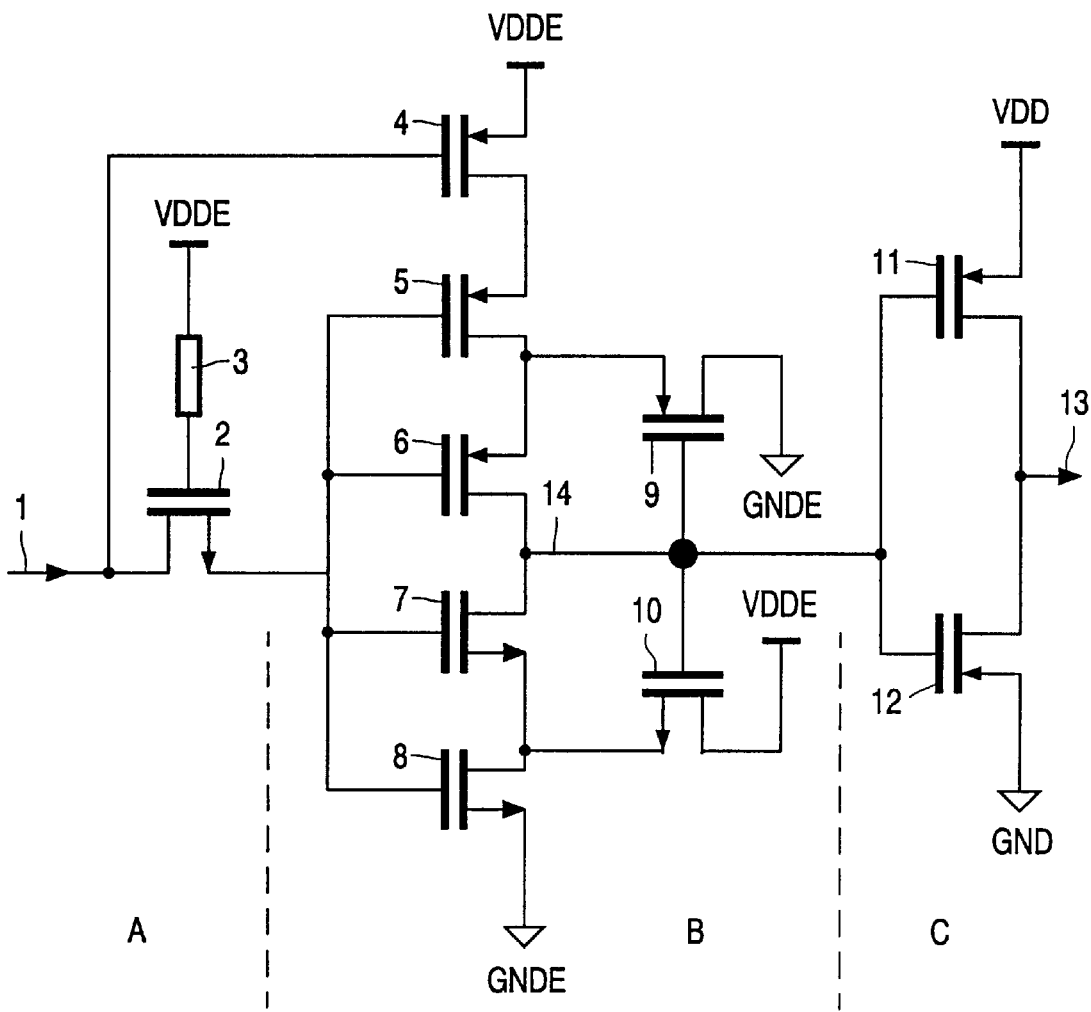
FIG. 1 shows an input pad with a level shifter circuit and a buffer circuit.

FIG. 1 shows an input pad comprising a level shifter circuit A, a buffer circuit B and an output stage C. The level shifter circuit A comprises an input 1, a series pass transistor 2 and a resistor 3. Resistor 3 is connected between an external supply voltage and a gate of transistor 2. The buffer circuit B comprises five transistors 4, 5, 6, 7 and 8, connected in series between an external supply voltage and external ground. Transistors 4, 5 and 6 are of P-type and transistors 7 and 8 are of N-type. The gate of transistor 4 is connected to input 1. The drains of transistors 6 and 7 are connected to the gates of P-type transistor 9 and N-type transistor 10. The source of transistor 9 is connected to the connection between the drain of transistor 5 and the source of transistor 6. The drain of transistor 9 is connected to external ground. The source of transistor 10 is connected to the connection between the source of transistor 7 and the drain of transistor 8. The drain of transistor 10 is connected to the external supply voltage.

The gates of transistors 5, 6, 7 and 8 are all connected to the source of transistor 2. The junction between the gates of transistors 9 and 10 and the drains of transistors 6 and 7 further is connected to an input of inverter C. Inverter C comprises transistors 11 and 12, connected in series between the core supply voltage and the core ground. The gates of transistors 11 and 12 are connected to the junction between the gates of transistors 9 and 10. The connection between the drains of the transistors 11 and 12 is the output 13 of the inverter.

In the level shifter circuit A transistor 2 is an N-type transistor so it will pass a low voltage at input 1 without any attenuation. If a high voltage appears at input 1 level shifter circuit A will pass a voltage equal to either the input voltage or the external supply voltage minus a threshold voltage drop across transistor 2 minus a voltage drop due to the body effect. Thereby high voltages at the input 1 that are higher than the external supply voltage are clamped to the above described voltage.

Assume that a high voltage is present at input 1. In that case the junction between the gates of transistors 9 and 10 and the drains of transistor 6 and 7, hereinafter junction 14, will be low. Thus transistor 9 will be on and transistor 10 will be off. If the voltage at the input 1 starts falling the transistors 4 and 5 will turn on first. The potential at the source of transistor 6 is controlled by the strengths of the transistors 4, 5 and 9, which form a controllable potential divider. Since junction 14 is still low, output 13 is still high. In order for output 13 to change to low the input voltage at input 1 has to fall below the voltage at the source of transistor 6 minus the threshold voltage of transistor 6. When the voltage at the input 1 passes that voltage from a higher voltage to a lower voltage the voltage at junction 14 rises and the voltage at output 13 goes low. Therefore that input voltage is the lower trigger point voltage. As a consequence by controlling the voltage at the source of transistor 6 the voltage level is controlled at which the input pad changes its state at output 13 from high to low.

Similarly assume input 1 to be low. In that case junction 14 will be high. As a consequence transistor 10 will be on and transistor 9 will be off. If now voltage at input 1 starts rising transistor 8 will turn on first as its source is grounded. The potential at the source of transistor 7 will be controlled by the strengths of the transistors 8 and 10, which together form a controllable voltage divider. Now, for output 13 to change to high, the input voltage at input 1 has to rise above the voltage at the source of transistor 7 plus the threshold voltage of transistor 7. As soon as the voltage at input 1 rises from below that voltage to above that voltage output 13 changes from low to high. Therefore that voltage at input 1 is the upper trigger point voltage. As a consequence by controlling the voltage at the source of transistor 7 the voltage level is controlled at which the input pad will change its state at output 13 from low to high.

In a nominal situation, in which the external supply voltage is 3.3 V, the internal supply voltage is 1.8 V, the temperature is 25° C. and the input slew rate is 1 ns, the upper trigger point voltage is about 1.7 V, the lower trigger point voltage is about 1.0 V, and hysteresis is about 0.7 V. The rise and fall delay times are about 1.4 ns and 1.1 ns, respectively and a maximum frequency of operation of the input pad is about 128 M/z.

By varying the length-to-width ratio of transistor 10 the upper trigger point voltage may be controlled to a certain degree. However when the upper trigger point voltage is varied to a high value, in the order of 2.0 V, the input pad does not operate flawless anymore. This is because of the inability of the level shifter circuit A to pass high voltages to the level of the upper trigger point voltage. It also appears that the rise and fall delays of the input pad are quite asymmetric.

Figure 2:
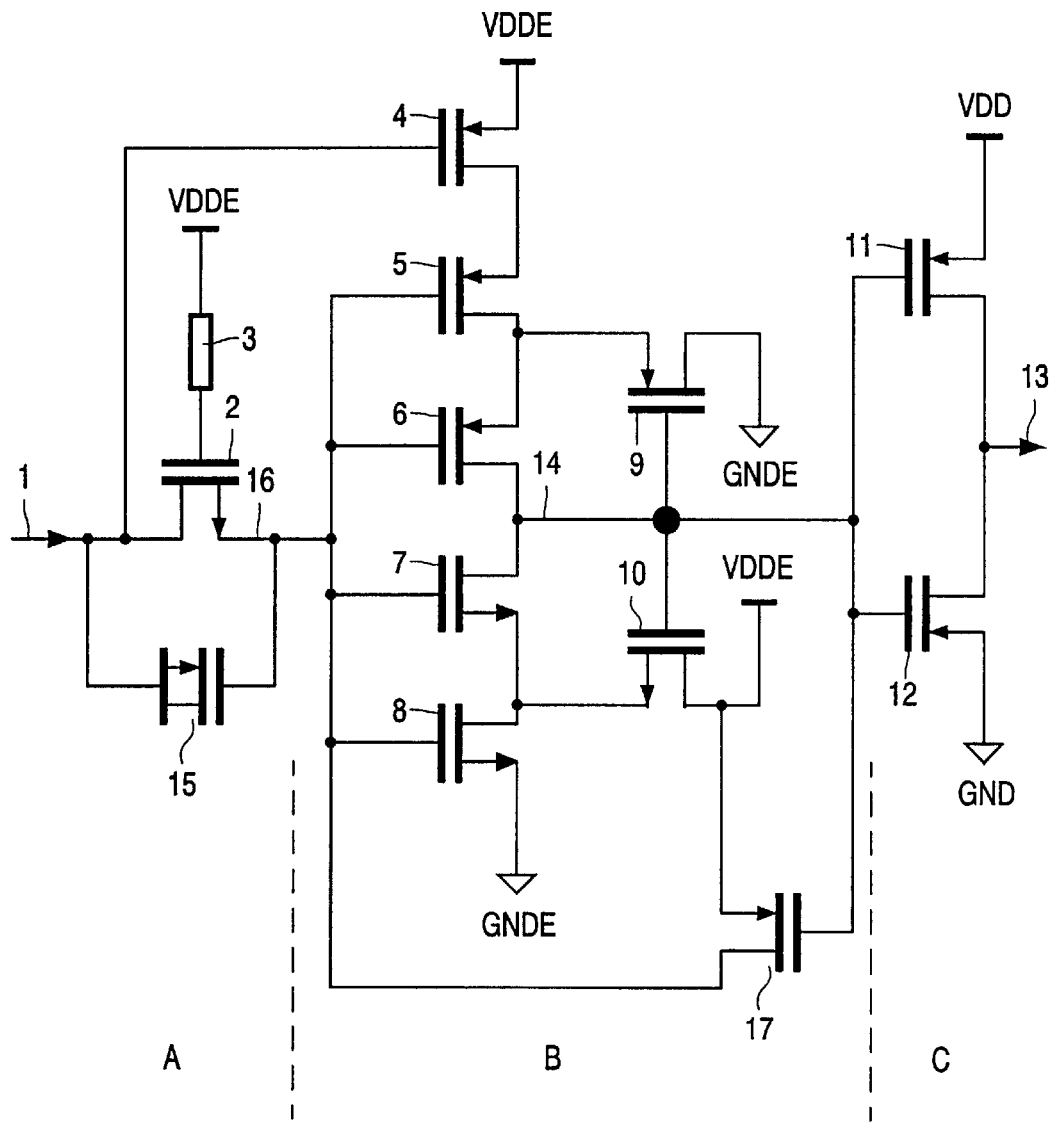
FIG. 2 shows an input pad with a transistorized capacitor parallel to a series pass transistor and a pull up transistor.

FIG. 2 shows an improvement of the input pad shown in FIG. 1. Identical elements in FIG. 2 and in FIG. 1 have been identified with the same reference numerals and will not be described here anymore.

A transistorized capacitor 15 is connected between input 1 and junction 16. Junction 16 is the level shifter circuit output. The transistorized capacitor 15 is formed by connecting the drain, the source and the bulk together to form one terminal while the gate forms the other terminal. Since transistorized capacitor 15 is formed using a P-type transistor the bulk is nothing but the N WELL in which it is placed. Furthermore a transistor 17 is connected between the external supply voltage and junction 16 and the gate of transistor 17 is connected to junction 14.

Transistorized capacitor 15 couples the voltage at the input 1 to output 16 of level shifter circuit A. It appears that a pulse voltage present at input 1 is not completely coupled to output 16 of the level shifter circuit but is distributed between transistorized capacitor 15 and the input capacitance of the buffered circuit B. Thus even if the input voltage at input 1 rises to 5 V the output voltage present at the output of the level shifter circuit A at junction 16 does not go beyond 2.9 V and finally to 3.3 V through transistor 17. This avoids stress on the transistors of the buffer circuit B.

It has been found that transistorized capacitor 15 plays a dual role. First it speeds up the input pad. Secondly it enhances the voltage at the output of the level shifter circuit when a high voltage appears at input 1. As a consequence it is possible to achieve higher values of the upper trigger point voltage. It is also to be noted that no charge accumulation takes place because transistorized capacitor 15 because it is shunted by a very low resistance of the series pass transistor 2 which is permanently ON.

Transistor 17 improves reliability of operation of the input pad.

Further is has to be noted that if high pulse appears at input 1 a part of that high pulse will be coupled to the buffer circuit B through transistorized capacitor 15. If that voltage is greater than the external supply voltage VDDE minus the threshold voltage of transistor 5 it may be possible that transistor 2 turns off making junction 16 to be floating. However it is perfectly alright if at that point of time junction 16 is floating since the input pad has already made the transition to a high voltage at output 13 and will not change its state at output 13 unless the voltage at input 1 goes below the lower triggerpoint voltage. It is also to be noted that junction 16 will not be floating anymore as soon as any one of input 1 or junction 16 falls below value of VDDE minus the threshold voltage of transistor 5.

In order to prevent any junctions from floating transistor 17 is connected in such a fashion that junction 16 will not be floating. Transistor 17 acts as weak pull-up at the output of the level shifter circuit A when the input voltage at input 1 goes high and crosses the upper trigger point voltage.

In the circuit according to FIG. 2 the upper triggerpoint voltage is about 2.2 V and the lower triggerpoint voltage is about 1 V. Hysteresis is about 1.2 V. Rise and fall delays are about 1.4 ns and 1.2 ns, respectively. When the input slew of the input pad shown in FIG. 2 varies from 0.5 ns to 15 ns the rise and fall delays vary from 1.5 ns to 4.3 ns and from 1.1 ns to 3.4 ns, respectively. For each input slew the rise and fall delays are close, but improvement is possible. The delays come closer to each other when the value of transistorized capacitor 15 is increased. However increasing capacitance of transistorized capacitor 15 requires more space in the layout. Furthermore increasing the value of transistorized capacitor 15 enhances stress on the transistors of the buffer circuit B when a high voltage pulse greater than the external supply voltage VDDE is supplied at input 1. A maximum operating frequency of the input pad shown in FIG. 2 is about 208 MHz, which is a considerable improvement over the input pad shown in FIG. 1.

Figure 3:
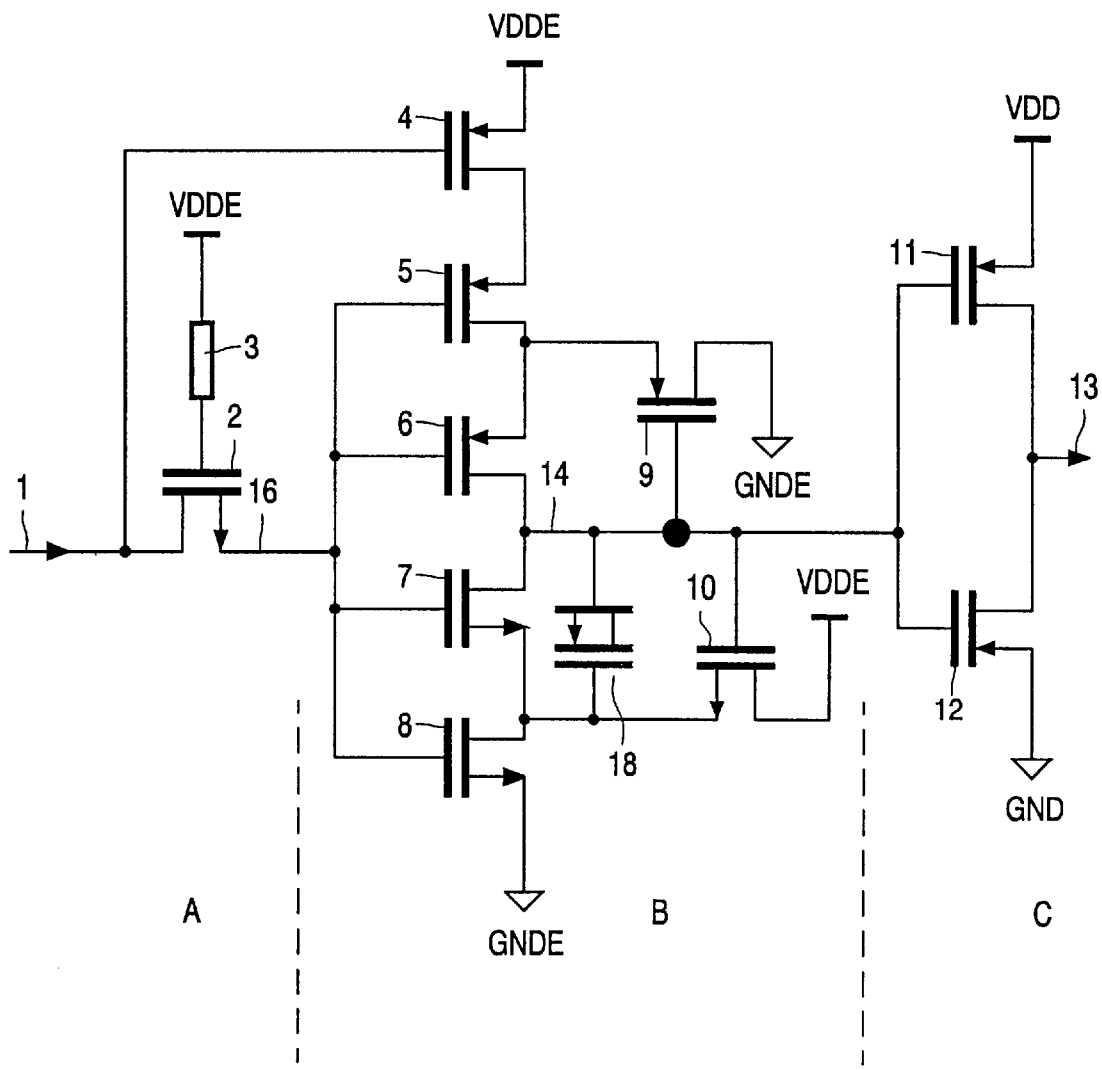
FIG. 3 shows an input pad comprising a transistorized capacitor connected between an output of an inverter and an output of a controllable voltage divider.

FIG. 3 shows another way for improving the input pad shown in FIG. 1. Also in FIG. 3 identical elements as in FIG. 1 have been identified by the same reference numerals. The input pad shown in FIG. 3 differs from the input pad shown in FIG. 1 in that a transistorized capacitor 18 has been connected between junction 14 and the source of transistor 10.

The addition of transistorized capacitor 18 has a same effect as the addition of transistorized capacitor 15 in the input pad shown in FIG. 2.

When an input signal at input 1 goes high transistor 8 turns on taking the drain of transistor 8 low. That fall at the drain of transistor 8 is coupled to the gate of transistor 10 through transistorized capacitor 18. That reduces the drive through transistor 10, thereby causing the drain of transistor 8 to fall further. Thereby a positive feedback has been realized. Due to the positive feedback the input pad will change state even though a voltage at junction 16 would not have been high enough when the transistorized capacitor 18 would not have been present.

Under nominal conditions the upper trigger point voltage is about 2 V, the lower triggerpoint voltage is about 1 V and the hysteresis is about 1.2 V. The rise and fall delays are both 1.4 ns. For input slew varying from 0.5 ns to 4.0 ns the rise and fall delays vary from 1.35 ns to 1.43 ns and from 1.31 ns to 2.01 ns, respectively. For larger values of the input slew of 10 ns and 15 ns rise and fall delays deviate considerably.

The symmetry in the output rise and fall delays is better than that symmetry for the input pad shown in FIG. 2. The maximum operating frequency however is slightly less and amounts to 187 MHz. The larger fall delay at larger values of the input slew can not be reduced by increasing the value of transistorized capacitor 18 any further. To reduce that delay the width of transistors 7 and 8 would have to be increased, but such increase causes asymmetry in the delay times.

Figure 4:
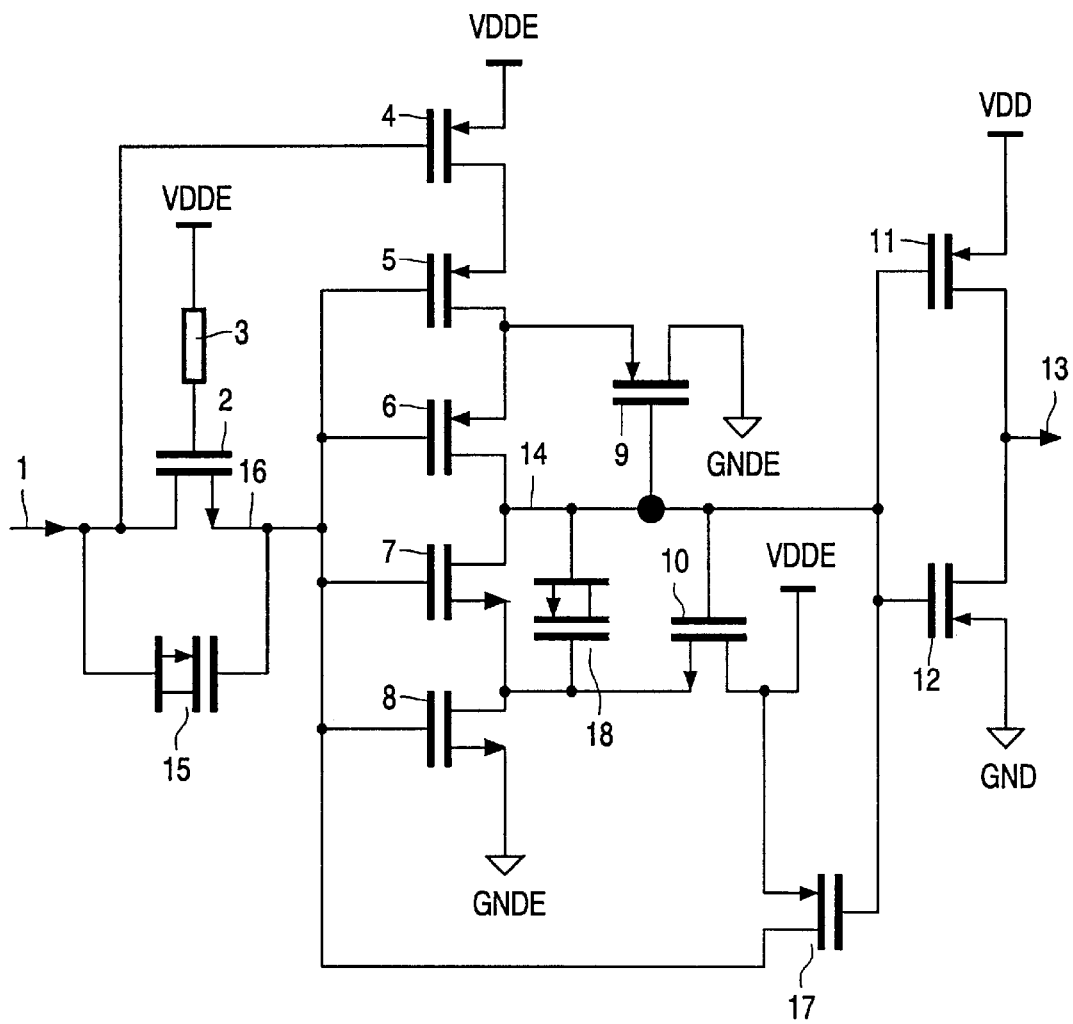
FIG. 4 shows an input pad with a transistorized capacitor connected in parallel to a series pass transistor, a transistorized capacitor connected between an output of an inverter and an output of a controllable voltage divider and a pull up transistor.

FIG. 4 shows a further embodiment of an input pad, essentially combining the measures taken in the input pad shown in FIGS. 2 and 3 to improve the input pad shown in FIG. 1. Identical elements as in FIGS. 1, 2 and 3 have been identified by identical reference numerals and will not be described in detail here anymore. Transistorized capacitor 15 has been connected between input 1 and junction 16, transistorized capacitor 18 has been connected between junction 14 and the source of transistor 10 and transistor 17 has been connected between the external supply voltage VDDE and junction 16 with the gate of transistor 17 connected to junction 14.

The combination of transistorized capacitors 15 and 18 in the input pad shown in FIG. 1, makes the rise and fall delays to be highly symmetric in all conceivable process, voltage and temperature conditions as well as at different input slew rates. By applying both transistorized capacitor 15 and transistorized capacitor 18 individual values of those transistorized capacitors may be reduced by almost 50% relative to their values in the input pads shown in FIGS. 2 and 3, respectively. A further advantage thereof is that reduction of the capacitance value of capacitor 15 will prevent stress to occur on the transistors of the buffer circuit B.

The upper trigger point voltage of the input pad shown in FIG. 4 is about 2.2 V, the lower triggerpoint is about 1 V and hysteresis is about 1.2 V. Under nominal conditions the rise and fall delays are 1.27 ns and 1.36 ns. For input slew rates varying from 0.5 ns to 15 ns the rise and fall delays vary from 1.23 ns to 3.57 ns and from 1.28 ns to 3.71 ns, respectively. Furthermore a maximum frequency of operation of the input pad shown in FIG. 4 is about 226 MHz.

After the above description of the invention various modifications and improvements will be obvious to the person skilled in the art. All such modifications and improvements are considered to be within the scope of the present invention.

What is claimed is:

1. Multiple voltage environment input pad with a circuit input, comprising: a level shifter circuit and a buffer circuit, wherein the level shifter circuit includes a level shifter circuit input connected to the circuit input and a level shifter circuit output, wherein the buffer circuit includes an inverter comprising at least two transistors of opposite types, with an input, connected to the level shifter circuit output, and an output, twin controllable voltage dividers of opposite types, each with at least two controllable voltage divider inputs and a controllable voltage divider output, wherein for each of the controllable voltage dividers one of the inputs is connected to the level shifter circuit output and another one of the inputs is connected to the inverter output, and wherein for each of the controllable voltage dividers the voltage divider output is connected to a current input connection of a transistor of corresponding type of the inverter, an input pad output being connected to the inverter output, wherein the level shifter circuit including a series pass transistor, and wherein a transistorized capacitor is connected in parallel to the series pass transistor.

2. Input pad according to claim 1, wherein the transistorized capacitor is connected between the output (14) of the inverter and the output of one of the two controllable voltage dividers.

3. Input pad according to claim 2, wherein the one of the two controllable voltage dividers is of N-type polarity.

4. Input pad according to claim 1 wherein a weak pull up element is connected to the output of the level shifter circuit.

5. Input pad according to claim 4, wherein the weak pull up element comprises a pull up transistor connected between a supply voltage and the output of the level shifter circuit and that a control input of the pull up transistor is connected to the output of the inverter.

6. Multiple voltage environment input pad with hysteresis comprising: a level shifter circuit and a buffer circuit, wherein the level shifter circuit is coupled to the buffet circuit, and the level shifter circuit includes a series pass transistor, and wherein the buffer circuit defines upper and lower trigger point voltages of the input pad; and a transistorized capacitor is connected in parallel to the series pass transistor.

* * * * *